(12) United States Patent
Huang et al.

(10) Patent No.: US 10,820,421 B2
(45) Date of Patent: Oct. 27, 2020

(54) DISPLAY PANEL AND DISPLAY DEVICE

(71) Applicant: Xiamen Tianma Micro-Electronics Co., Ltd., Xiamen (CN)

(72) Inventors: Wei Huang, Xiamen (CN); Zhanshu Wang, Xiamen (CN); Mingyan Huang, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/423,479

(22) Filed: May 28, 2019

(65) Prior Publication Data
US 2020/0214137 A1 Jul. 2, 2020

(30) Foreign Application Priority Data
Dec. 29, 2018 (CN) .......................... 2018 1 1630097

(51) Int. Cl.
| | |
|---|---|
| H05K 1/00 | (2006.01) |
| H05K 1/02 | (2006.01) |
| H05K 1/14 | (2006.01) |
| H05K 1/18 | (2006.01) |
| H01L 27/32 | (2006.01) |
| G02F 1/13 | (2006.01) |

(Continued)

(52) U.S. Cl.
CPC .......... H05K 1/189 (2013.01); H05K 1/0281 (2013.01); *H05K 2201/0145* (2013.01); *H05K 2201/056* (2013.01); *H05K 2201/10128* (2013.01)

(58) Field of Classification Search
CPC .. H05K 1/00; H05K 1/02; H05K 1/14; H05K 1/18; H01L 27/32; G02F 1/13; G02F 1/133; G02F 1/1333; G02F 1/1335; G02F 1/1345

USPC ............. 361/749; 345/1.3, 87, 92, 173, 206; 349/46, 58, 106, 149, 150, 158; 439/67
See application file for complete search history.

(56) References Cited

U.S. PATENT DOCUMENTS

| | | | | |
|---|---|---|---|---|
| 5,528,403 A | * | 6/1996 | Kawaguchi | ......... G02F 1/13452 349/149 |
| 5,592,199 A | * | 1/1997 | Kawaguchi | ......... G02F 1/13452 257/E23.065 |

(Continued)

FOREIGN PATENT DOCUMENTS

CN 107466158 A 12/2017

*Primary Examiner* — Xiaoliang Chen
(74) *Attorney, Agent, or Firm* — Tarolli, Sundheim, Covell & Tummino LLP

(57) ABSTRACT

A display panel and a display device are provided. The display panel includes a rigid underlay and a flexible circuit board. The rigid underlay includes: a first surface including connection pins, and a second surface. The flexible circuit board includes a first flat portion, a bending portion, and a second flat portion. The bending portion is located between the first and second flat portions. The first flat portion contacts with the first surface. The bending portion is attached to the second surface. The second flat portion is positioned at a side of the rigid underlay facing away from the first surface with the bending portion bended. The first flat portion is electrically connected to the connection pins. The second flat portion includes a driving circuit connected to the connection pins through the flexible circuit board. An angle between the first and second surfaces is a rounded or chamfered angle.

11 Claims, 3 Drawing Sheets

(51) Int. Cl.
*G02F 1/133* (2006.01)
*G02F 1/1333* (2006.01)
*G02F 1/1335* (2006.01)
*G02F 1/1345* (2006.01)

(56) References Cited

U.S. PATENT DOCUMENTS

| | | | | |
|---|---|---|---|---|
| 2002/0027634 A1* | 3/2002 | Kang | ............... | H05K 3/361 |
| | | | | 349/150 |
| 2002/0135727 A1* | 9/2002 | Nakaminami | ...... | G02F 1/13452 |
| | | | | 349/149 |
| 2007/0117418 A1* | 5/2007 | Azuma | ............ | G02F 1/133308 |
| | | | | 439/67 |
| 2007/0242207 A1* | 10/2007 | Fujita | ............... | H05K 3/361 |
| | | | | 349/149 |
| 2008/0117367 A1* | 5/2008 | Abe | ............... | G02F 1/13452 |
| | | | | 349/106 |
| 2008/0198289 A1* | 8/2008 | Oohira | ............ | G02F 1/133308 |
| | | | | 349/46 |
| 2010/0110328 A1* | 5/2010 | Tatebayashi | ......... | G02B 6/0091 |
| | | | | 349/58 |
| 2011/0120770 A1* | 5/2011 | Yokonuma | ........... | H05K 1/0215 |
| | | | | 174/94 S |
| 2012/0235948 A1* | 9/2012 | Inoue | .................. | G02F 1/13338 |
| | | | | 345/173 |
| 2013/0021571 A1* | 1/2013 | Lee | ....................... | H05K 3/3452 |
| | | | | 349/150 |
| 2014/0307396 A1* | 10/2014 | Lee | ....................... | H05K 1/028 |
| | | | | 361/749 |
| 2014/0362327 A1* | 12/2014 | Ohkubo | ............ | G02F 1/133608 |
| | | | | 349/58 |
| 2015/0036300 A1* | 2/2015 | Park | ............... | H01L 51/5253 |
| | | | | 361/749 |
| 2016/0253935 A1* | 9/2016 | Gerets | ................ | G02F 1/13318 |
| | | | | 345/1.3 |
| 2017/0032737 A1* | 2/2017 | Lee | ....................... | H01L 51/003 |
| 2017/0047547 A1* | 2/2017 | Son | ....................... | H01L 25/167 |
| 2017/0215288 A1* | 7/2017 | Shi | ........................ | H05K 1/028 |
| 2017/0338294 A1* | 11/2017 | Choi | .................. | H01L 27/3276 |
| 2018/0143496 A1* | 5/2018 | Hosoki | ................ | G02B 6/0031 |
| 2018/0151641 A1* | 5/2018 | Choo | .................. | G06F 1/1643 |
| 2018/0157093 A1* | 6/2018 | Jang | .................. | G02B 6/0093 |
| 2018/0196300 A1* | 7/2018 | Jung | .................. | G02F 1/13452 |
| 2018/0204884 A1* | 7/2018 | Isa | ........................ | H05B 33/26 |
| 2019/0207130 A1* | 7/2019 | He | ....................... | H01L 51/0097 |

\* cited by examiner

United States Patent
US 10,820,421 B2

DISPLAY PANEL AND DISPLAY DEVICE

CROSS-REFERENCE TO RELATED APPLICATIONS

The present application claims priority to Chinese Patent Application No. 201811630097.9, filed on Dec. 29, 2018, the content of which is incorporated herein by reference in its entirety.

TECHNICAL FIELD

The present disclosure relates to the field of display technologies, and, particularly, relates to a display panel and a display device.

BACKGROUND

At present, with the continuous development of display technologies, the requirements on the apparent size of the display screen are getting higher and higher. In particular, for mobile display products such as mobile phones, they are required to have a narrow border and a high screen-to-body ratio. That is, it is desirable that the size of the non-display region surrounding the display region of the display panel becomes smaller and smaller.

In order to increase the screen-to-body ratio of the display panel, the driving chip for driving the display panel to display may be usually bound to a flexible printed circuit (FPC), that is, a chip on film (COF) technology is used, and then the COF is bent to the backlight side of the display panel so as to increase the screen-to-body ratio of the display panel.

However, with the design in the related art, the size of protruding portion of the COF after bending the COF is large, so that the size of the border region of the display panel is still large, and the increase of the screen-to-body ratio of the display panel is limited.

SUMMARY

In view of this, the present disclosure provides a display panel and a display device, which can reduce the amount of bending protrusion of the COF after the COF is bent.

In a first aspect, the present provides a display panel, and the display panel includes: a rigid underlay including a first surface and a second surface, the first surface including a plurality of connection pins; and a flexible circuit board including a first flat portion, a bending portion, and a second flat portion. The bending portion is located between the first flat portion and the second flat portion. The first flat portion is in contact with the first surface, the bending portion is attached to the second surface. The second flat portion is positioned at a side of the rigid underlay facing away from the first surface with the bending portion bended, and the first flat portion is electrically connected to the plurality of connection pins. The second flat portion includes a driving circuit, and the driving circuit is connected to the plurality of connection pins through the flexible circuit board. An angle between the first surface and the second surface is a rounded angle or chamfered angle.

In a second aspect, the present disclosure provides a display device, and the display device includes any of the display panel provided in the present disclosure.

BRIEF DESCRIPTION OF DRAWINGS

In order to more clearly explain the technical solution in embodiments of the present disclosure, the drawings to be used in the description of the embodiments will be briefly described below. The drawings in the following description are only some embodiments of the present disclosure. For those skilled in the art, other drawings may also be obtained based on these drawings without paying any creative efforts.

DESCRIPTION OF EMBODIMENTS

In order to better understand technical solutions of the present disclosure, the embodiments of the present disclosure are described in details with reference to the drawings.

It should be clear that the described embodiments are merely a part of the embodiments of the present disclosure rather than all of the embodiments. All other embodiments obtained by those skilled in the art without paying creative efforts shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after "/" is an "or" relationship.

It should be understood that although the terms 'first' and 'second' may be used in the present disclosure to describe surfaces, these surfaces should not be limited to these terms. These terms are used only to distinguish the surfaces from each other. For example, without departing from the scope of the embodiments of the present disclosure, a first surface may also be referred to as a second surface. Similarly, the second surface may also be referred to as the first surface.

Figure 1:
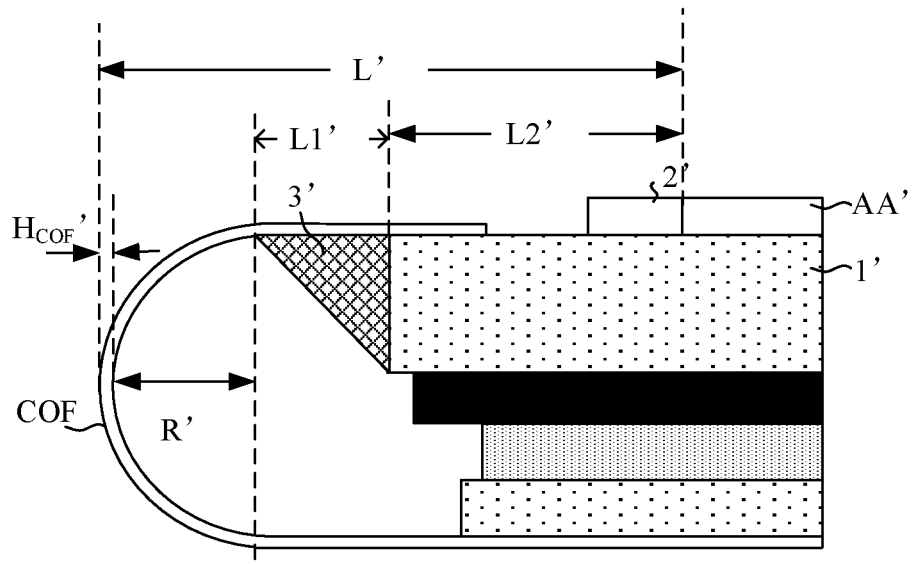
FIG. 1 is a schematic cross-sectional view of a display panel at a position of a lower border in the prior art.

FIG. 1 is a schematic cross-sectional view of a display panel at a position of a lower border in the related art. As shown in FIG. 1, the display panel includes a thin film transistor (TFT) array substrate 1', and an opposite substrate 2' arranged opposite to the TFT array substrate 1'. The opposite substrate 2' includes a display region AA'. A plurality of sub-pixels for display is included in the display region AA'.

As shown in FIG. 1, the display panel further includes a COF bound to the TFT array substrate 1'. In order to protect each TFT in the TFT array substrate from erosion by external water and oxygen, a dispensed adhesive 3' may be arranged at the edge of the TFT array substrate 1'. The presence of the dispensed adhesive 3' makes the COF unable to attach to the edge position of the TFT array substrate 1', resulting in a gap between them. That is, as shown in FIG. 1, at this time, a border size L' of the display panel (i.e., a distance from the left edge of the display region AA' to the leftmost of the COF) satisfies: $L'=L2'+L1'+R'+H_{COF}'+\sigma'$, where L1' is a width of the dispensed adhesive 3', L2' is a length of the lower step of the TFT array substrate 1'; $H_{COF}'$, is a thickness of the COF, R' is a bending radius of the lower edge of the COF, and σ' is an assembly tolerance. Under the current processing conditions, the width L1' of the dispensed adhesive 3' is 0.4 mm, the bending radius R' of the lower edge of the COF is 0.37 mm, the length L2' of the lower step of the TFT array substrate 1' is 4.415 mm, and the assembly tolerance σ' is 0.2 mm. In this way, the distance L' from the left edge of the display region AA' to the leftmost of the COF is up to 2.385 mm, resulting in a large size of the non-display region of the display panel, which is disadvantageous to the narrow border design of the display panel.

Figure 2:
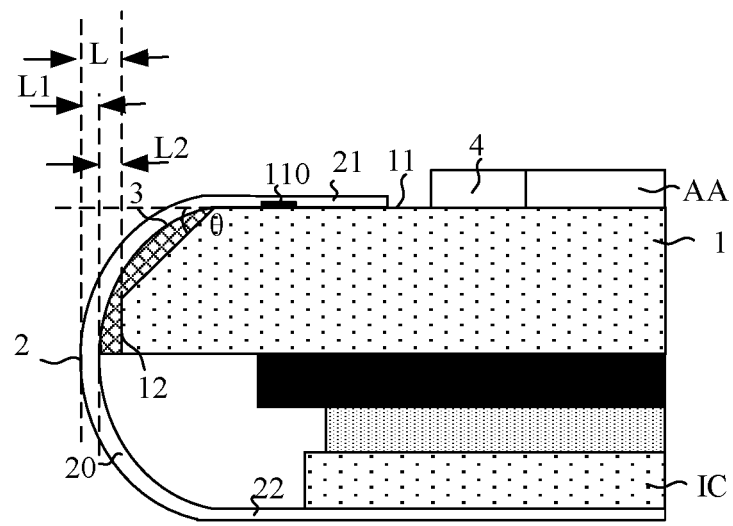
FIG. 2 is a schematic cross-sectional view of a display panel at a position of a lower border according to an embodiment of the present disclosure.
Figure 3:
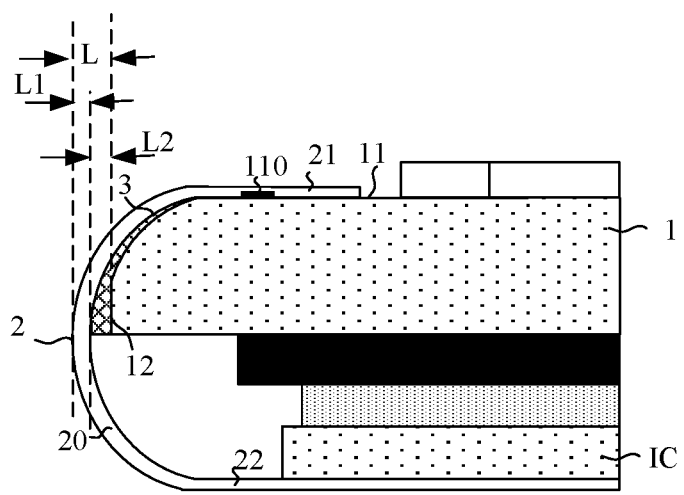
FIG. 3 is a schematic cross-sectional view of a display panel at a position of a lower border according to another embodiment of the present disclosure.

In view of this, the present disclosure provides a display panel. As shown in FIGS. 2 and 3, FIGS. 2 and 3 are respectively schematic cross-sectional views of two display panels at their respective lower borders according to the embodiments of the present disclosure. The display panel includes a rigid underlay 1 and a flexible circuit board 2. The rigid underlay 1 includes a first surface 11 and a second surface 12. The first surface 11 includes a plurality of connection pins 110. The flexible circuit board 2 includes a first flat portion 21, a bending portion 20 and a second flat portion 22. The bending portion 20 is located between the first flat portion 21 and the second flat portion 22. The first flat portion 21 is in contact with the first surface 11. The bending portion 20 is attached to the second surface 12. The second flat portion 22 is bent by the bending portion 20 to a side of the rigid underlay 1 facing away from the first surface 11. The first flat portion 21 is electrically connected to the connection pins 110. The second flat portion 22 includes a driving circuit IC. The driving circuit IC is connected to the connection pins 110 through the flexible circuit board 2. An angle between the first surface 11 and the second surface 12 is a rounded angle as shown in FIG. 3 or a chamfered angle as shown in FIG. 2.

In some embodiments of the present disclosure, as shown in FIG. 2, a display substrate 4 arranged opposite to the rigid underlay 1 may be arranged at a side of the first surface 11 of the rigid underlay 1. The display substrate 4 includes a display region AA provided with a plurality of sub-pixels for display. When the display panel is in operation, a signal from the driving circuit IC is transmitted to the connection pins 110 through the flexible circuit board 2, and the connection pins 110 are each connected to a signal line such as a data line located in the display region AA through a connection line (not shown), in order to cause the display region AA to display an image.

It should be noted that the expression "the bending portion 2 is attached to the second surface 12" means that there is no gap between the bending portion 2 and the second surface 12, that is, the attachment between the bending portion 2 and the second surface 12 includes directly contact and attachment between the bending portion 2 and the second surface 12, and further includes attachment between the bending portion 2 and the second surface 12 through another intervening film layer, as long as the gap between the bending portion 2 and the second surface 12 is absent.

With the display panel provided by the embodiments of the present disclosure, compared with setting the angle between the first surface 11 and the second surface 12 as a right angle in the related art, setting the angle between the first surface 11 and the second surface 12 of the rigid underlay 1 of the display panel as a rounded angle or a chamfered angle, a relatively smooth transition region can be formed at a connection position between the first surface 11 and the second surface 12. In this way, when the bending portion 20 of the flexible circuit board is bent, the bending portion 20 can be attached to the connection position between the first surface 11 and the second surface 12. That is, the bending portion 20 can be completely folded, which avoids the presence of the gap between the rigid underlay 1 and the flexible circuit board 2 while maintaining the bending reliability of the flexible circuit board 2. Therefore, the protruding amount of bending of the bending portion 20 with respect to the edge of the rigid underlay 1 becomes smaller, that is, the size of the non-display region of the display panel is reduced, thereby increasing the screen-to-body ratio of the display panel.

It can be understood that, as shown in FIG. 2, the distance between the left edge of the display region AA and the leftmost end of the rigid underlay 1, that is, the size of stepped portion for arranging the signal lines such as the data lines and the like and the connection pins 110 included in the connection display region AA, is generally fixed, which cannot be further reduced with respect to the related art. Therefore, in the embodiments of the present disclosure, the amount of protrusion of the bending portion 20 of the flexible circuit board 2 is adjusted relative to the rigid substrate 1 so as to reduce the size of the non-display region of the display panel, thereby increasing the screen-to-body ratio of the display panel.

In the embodiments of the present disclosure, as shown in FIG. 2, a moisture-oxygen-proof film layer 3 is arranged between the bending portion 20 and the first surface 11 and/or between the bending portion 20 and the second surface 12. In the embodiments of the present disclosure, by arranging the moisture-oxygen-proof film layer 3 between the bending portion 20 and the first surface 11, moisture and/or oxygen in the external environment can be prevented from entering into the rigid underlay 1, so that moisture and/or oxygen in the external environment can be prevented from affecting various electronic devices including TFTs and the like in the display panel, thereby improving durability of the display panel.

In some embodiments of the present disclosure, as shown in FIG. 2, a relationship among a distance L between an end of the bending portion 20 protruding from the rigid underlay 1 and an end of the rigid underlay 1 near the bending portion 20, a thickness L1 of the flexible circuit board, and a thickness L2 of the moisture-oxygen-proof film layer satisfies: $L=L1+L2+\sigma$, wherein σ is the attachment tolerance between the flexible circuit board 2 and the rigid underlay 1. That is, with the design of the embodiments of the present disclosure, the bending portion 20 of the flexible circuit board 2, the moisture-oxygen-proof film layer 3, and the second surface 12 of the rigid underlay 1 can be seamlessly attached. Compared with the related art, the distance L between an end of the bending portion 20 protruding from the rigid underlay 1 and an end of the rigid underlay 1 near the bending portion 20 can be reduced by the portion of the bending radius of the bending portion 20, thereby greatly reducing the size of the non-display region of the display panel.

As shown in FIG. 2, in the embodiments of the present disclosure, the angle between the first surface 11 and the second surface 12 is set to be a rounded angle or chamfered angle, that is, a relatively smooth transition region can be formed at a connection position between the first surface 11 and the second surface 12, so that most of the above-mentioned moisture-oxygen-proof film layer 3 can be arranged in the transition region, and the case where the dispensed adhesive 3 as shown in FIG. 1 is set to be completely protruded from the TFT array substrate 1' can be avoided. That is to say, the thickness of the moisture-oxygen-proof film layer 3 on the second surface 12 of the rigid underlay 1 can be reduced, so that the size of the non-display region of the display panel can be further reduced.

Figure 4:
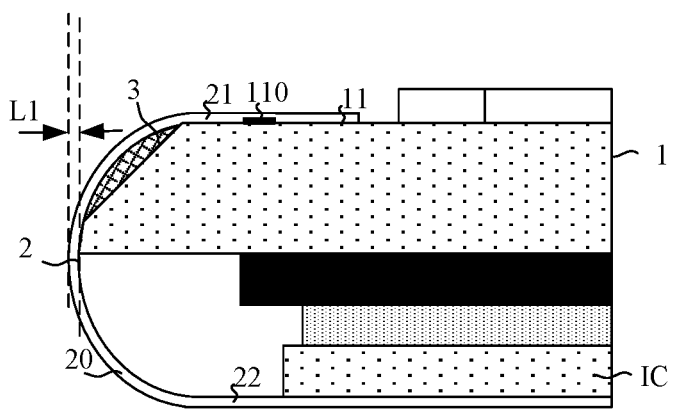
FIG. 4 is a schematic cross-sectional view of a display panel at a position of a lower border according to still another embodiment of the present disclosure.

FIG. 4 is a schematic cross-sectional view of a display panel at a position of a lower border according to yet another embodiment of the present disclosure. As shown in FIG. 4, in the embodiments of the present disclosure, the coverage area of the moisture-oxygen-proof film layer 3 on the substrate 1 can be reduced on the basis of ensuring the moisture-oxygen-proof effect, and only the moisture-oxygen-proof film layer 3 is arranged in the transition region formed at the connection position between the first surface 11 and the second surface 12 of the rigid underlay 1. In this case, as shown in FIG. 3, the thickness of the moisture-oxygen-proof film layer 3 on the second surface 12 can be reduced when calculating the distance L between an end of the bending portion 20 protruding from the rigid underlay 1 and an end of the rigid underlay 1 near the bending portion 20. Therefore, with the embodiments of the present disclosure, with respect to the structure of the display panel shown in FIG. 1, on the basis of ensuring the moisture-oxygen-proof resistance of the display panel, both of the width L1' of the dispensed adhesive and the bending radius R' of the COF can be subtracted from the distance L' from the left edge of the display region AA' to the leftmost side of the COF. That is, in the structure of the display panel shown in FIG. 3, the distance L between an end of the bending portion 20 protruding from the rigid underlay 1 and an end of the rigid underlay 1 near the bending portion 20 satisfies L=L1+ σ. Therefore, by using the solution shown in FIG. 3, on the basis of ensuring the functionality and durability of the display panel, the protrusion amount of bending of the bending portion 20 relative to the rigid underlay 1 can be reduced to the thickness of the flexible circuit board 2 itself and the attachment tolerance, so that the protrusion amount of bending of the bending portion 2 relative to the rigid underlay 1 can be greatly reduced, thereby further reducing the size of the non-display region of the display panel, and better adapting to the market demands.

In some embodiments of the present disclosure, as shown in FIG. 2, the thickness L2 of the moisture-oxygen-proof barrier layer 3 satisfies: 10 μm≤L2≤100 μm. In the embodiments of the present disclosure, by arranging the thickness L2 of the moisture-oxygen-proof barrier layer 3 to be equal to or smaller than 100 μm, the occurrence of large increase on the size of the non-display region of the display panel possibly caused by setting an excessive thickness of the moisture-oxygen-proof barrier layer 3 can be avoided. Further, in the embodiments of the present disclosure, by setting the thickness of the moisture-oxygen-proof film layer 3 to be equal to or greater than 10 μm, it is possible to ensure that the moisture-oxygen-proof film layer 3 can resist moisture and/or oxygen in the external environment from entering into the display panel.

In the embodiments of the present disclosure, the moisture-oxygen-proof film layer 3 includes a material of fluoride. The moisture-oxygen-proof film layer 3 is formed by spraying a fluorinated liquid.

In the related art, as shown in FIG. 1, the viscosity of the dispensed adhesive is generally large, therefore it is usually necessary to dispense at the edge of the TFT array substrate 1' by means of a needle or the like, which may cause an excessive thickness of the dispensed adhesive at some positions. Moreover, since the angle of the end portion of the TFT array substrate 1' in contact with the dispensed adhesive 3' is a right angle in the related art, the bonding force of the dispensed adhesive 3' on the TFT array substrate 1' is also small. If the COF is completely folded, the dispensed adhesive 3' may readily fall off. That is, the design shown in FIG. 1 limits the reduction in the size of the non-display region of the display panel. However, in the embodiments of the present disclosure, the angle between the first surface 11 and the second surface 12 is set to be a rounded angle or chamfered angle, so that a relatively smooth transition region can be formed at a connection position between the first surface 11 and the second surface 12. In this way, the moisture-oxygen-proof film layer 3 can be formed by spraying the fluorinating liquid in the transition region, thereby avoiding the occurrence of excessive thickness of local regions which may be caused by the dispensing method. Moreover, compared with the related art shown in FIG. 1 in which the thickness of the dispensed adhesive 3' is required to be at least 0.4 mm to achieve the function of moisture-oxygen proof, in the embodiments of the present disclosure, the method of spraying the fluorinating liquid can be better control the thickness of the moisture-oxygen-proof film layer 3 formed, and the thickness L2 is set to satisfy the condition of 10 μm≤L2≤100 μm. Moreover, the moisture-oxygen-proof film layer 3 and the rigid underlay 1 can be better attached by spraying, so that a gap between the moisture-oxygen-proof film layer 3 and the rigid underlay 1 can be avoided, thereby further ensuring that the size of the non-display region of the display panel may not be increased. In addition, the use of a fluorinated liquid to form the moisture-oxygen-proof film layer enables the formed moisture-oxygen-proof film layer 3 to isolate external water and oxygen even based on a small thickness, thereby ensuring the durability of the display panel.

In some embodiments of the present disclosure, the moisture-oxygen-proof film layer 3 may further include a material of polyethylene terephthalate (PET). When PET is used as the moisture-oxygen-proof film layer 3, PET may be attached on the rigid underlay 1.

Figure 5:
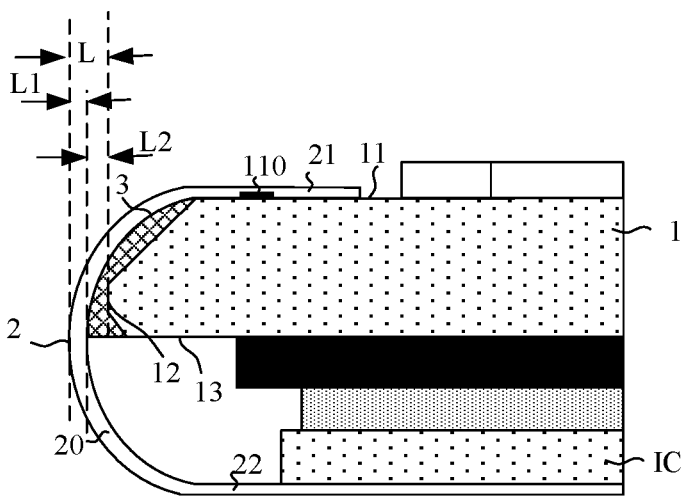
FIG. 5 is a schematic cross-sectional view of a display panel at a position of a lower border according to yet another embodiment of the present disclosure.

FIG. 5 is a schematic cross-sectional view of a display panel at a position of a lower border according to yet another embodiment of the present disclosure. In some embodiments of the present disclosure, as shown in FIG. 5, the rigid underlay 1 further includes a third surface 13. The third surface 13 is arranged opposite to the first surface 11. An angle between the third surface 13 and the second surface 12 is a rounded angle or chamfered angle. If the angle between the third surface 13 and the second surface 12 is set to be a right angle, the angle at the intersection portion between the second surface 13 and the second surface 12 is sharper, which may adversely affect the bending portion 20 when it comes into contact with the bending portion 20 bent to this position. Therefore, in the embodiments of the present disclosure, the angle between the third surface 13 and the second surface 12 is also set to be a rounded angle or chamfered angle, so that the bending portion 20 can be protected from being affected even if the bending portion 20 comes into contact with the angle between the third surface 13 and the second surface 12 due to the excessive large bending angle of the bending portion 20. Further, after the angle between the third surface 13 and the second surface 12 is also set to be a rounded angle or chamfered angle, the attachment between the moisture-oxygen-proof film layer 3 and the third surface 13 and/or the second surface 12 can be reinforced when the area of the moisture-oxygen-proof film layer 3 is designed to be large.

In some embodiments of the present disclosure, when the angle between the first surface 11 and the second surface 12 of the rigid underlay 1 is set to be a rounded angle, a radius R of the rounded angle satisfies: 2 mm≤R≤20 mm.

As shown in FIG. 2, when the angle between the first surface 11 and the second surface 12 of the rigid underlay 1 is set to be a chamfered angle, an angle θ of the chamfered angle satisfies: 10°≤θ≤80°.

In some embodiments of the present disclosure, the angle between the first surface 11 and the second surface 12 is a rounded angle or chamfered angle by polishing or edging the rigid underlay 1.

Figure 6:
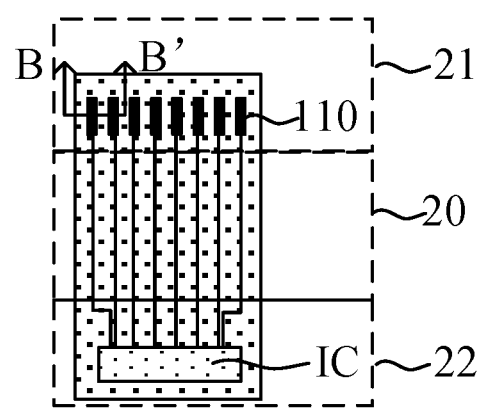
FIG. 6 is a top plan view of a flexible circuit board in a tiling state according to an embodiment of the present disclosure.
Figure 7:
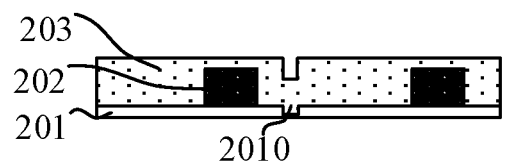
FIG. 7 is a schematic cross-sectional view taken along line BB' in FIG. 6.

FIG. 6 is a top plan view of a flexible circuit board in a tiling state according to an embodiment of the present disclosure; and FIG. 7 is a schematic cross-sectional view taken along line BB' in FIG. 6. In some embodiments of the present disclosure, as shown in FIGS. 6 and 7, the flexible circuit board 2 includes a flexible underlay 201, a metal layer 202 and a protective layer 203 which are laminated. The metal layer 202 is configured to form the connection pins 110. The protective layer 203 is configured to protect the connection pins 110. A groove 2010 is arranged at the position where the flexible underlay 201 is not overlapped with the connection pins 110, thereby alleviating the bending stress generated by the flexible underlay 201 at the time of bending, and thus improving the bending resistance of the flexible underlay 201.

Figure 8:
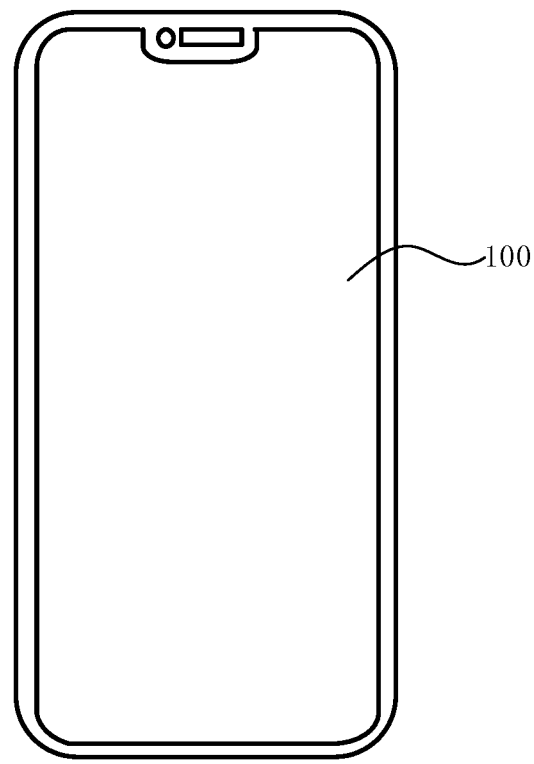
FIG. 8 is a structural schematic diagram showing a display device according to an embodiment of the present disclosure.

The present disclosure further provides a display device. FIG. 8 is a structural schematic diagram showing a display device according to an embodiment of the present disclosure. As shown in FIG. 8, the display device includes the display panel 100 described above. The specific structure of the display panel 100 has been described in detail in the above embodiments, which is not elaborated herein. The display device shown in FIG. 8 is merely illustrative. The display device may be any electronic device having a display function such as a mobile phone, a tablet computer, a laptop computer, an electronic paper book, or a television.

With the display panel and the display device provided by the embodiments of the present disclosure, the angle between the first surface and the second surface of the rigid underlay of the display panel is set to be a rounded angle or chamfered angle, so that setting the angle between the first surface and the second surface to be a right angle can be avoided. Therefore, a relatively smooth transition region can be formed at a connection position between the first surface and the second surface, so that when the bending portion of the flexible circuit board is bent, the bending portion can be attached to the connection position between the first surface and the second surface. Compared with the related art, the distance between the bending portion and the first surface and the distance between the bending portion and the second surface can be reduced, so that the distance between an end of the bending portion away from the display region and the display region can be reduced. That is, the size of the non-display region of the display panel can be reduced, and the screen-to-body ratio of the display panel can be increased.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel, comprising:
a rigid underlay comprising a first surface and a second surface, the first surface comprising a plurality of connection pins; and
a flexible circuit board comprising a first flat portion, a bending portion, and a second flat portion,
wherein the bending portion is located between the first flat portion and the second flat portion, the first flat portion is in contact with the first surface, the bending portion is attached to the second surface, the second flat portion is positioned at a side of the rigid underlay facing away from the first surface with the bending portion bended, and the first flat portion is electrically connected to the plurality of connection pins;
the second flat portion comprises a driving circuit, and the driving circuit is connected to the plurality of connection pins through the flexible circuit board,
an angle between the first surface and the second surface is a rounded angle or chamfered angle, and
a moisture-oxygen-proof film layer arranged between the bending portion and the first surface.

2. The display panel according to claim 1, wherein a distance L between an end of the bending portion protruding from the rigid underlay and an end of the rigid underlay close to the bending portion, a thickness L1 of the flexible circuit board, and a thickness L2 of the moisture-oxygen-proof film layer satisfy: L=L1+L2+σ, where σ is an attachment tolerance between the flexible circuit board and the rigid underlay.

3. The display panel according to claim 2, wherein the thickness L2 of the moisture-oxygen-proof film layer satisfies: 10 μm≤L2≤100 μm.

4. The display panel according to claim 1, wherein a material of the moisture-oxygen-proof film layer comprises fluoride, and the moisture-oxygen-proof film layer is formed by spraying a fluorinated liquid.

5. The display panel according to claim 1, wherein the moisture-oxygen-proof film layer comprises polyethylene terephthalate.

6. The display panel according to claim 1, wherein:
the rigid underlay further comprises a third surface arranged opposite to the first surface, and an angle between the third surface and the second surface is a rounded angle or chamfered angle.

7. The display panel according to claim 1, wherein the angle between the first surface and the second surface is a rounded angle, and a radius R of the rounded angle satisfies: 2 mm≤R≤20 mm.

8. The display panel according to claim 1, wherein the angle between the first surface and the second surface is a chamfered angle, and an angle θ of the chamfered angle satisfies: 10°≤θ≤80°.

9. The display panel according to claim 1, wherein the rounded angle or the chamfered angle between the first surface and the second surface is formed by polishing or edging the rigid underlay.

10. The display panel according to claim 1, wherein the flexible circuit board comprises a flexible underlay, a metal layer and a protective layer which are laminated, a groove is defined at a position where the flexible underlay is not overlapped with the plurality of connection pins.

11. A display device, comprising a display panel, wherein the display panel comprises:
a rigid underlay comprising a first surface and a second surface, the first surface comprising a plurality of connection pins; and
a flexible circuit board comprising a first flat portion, a bending portion, and a second flat portion,
wherein the bending portion is located between the first flat portion and the second flat portion, the first flat portion is in contact with the first surface, the bending portion is attached to the second surface, the second flat portion is positioned at a side of the rigid underlay facing away from the first surface with the bending portion bended, and the first flat portion is electrically connected to the plurality of connection pins;
the second flat portion comprises a driving circuit, and the driving circuit is connected to the plurality of connection pins through the flexible circuit board,
an angle between the first surface and the second surface is a rounded angle or chamfered angle, and
a moisture-oxygen-proof film layer arranged between the bending portion and the first surface.

* * * * *